(12) United States Patent
Nagasaki et al.

(10) Patent No.: US 10,412,839 B2
(45) Date of Patent: Sep. 10, 2019

(54) PRINTED CIRCUIT BOARD, POWER SUPPLY APPARATUS, IMAGE FORMING APPARATUS, AND PRINTED CIRCUIT BOARD MANUFACTURING METHOD

(71) Applicant: CANON KABUSHIKI KAISHA, Tokyo (JP)

(72) Inventors: Osamu Nagasaki, Numazu (JP); Masamichi Iida, Yokohama (JP); Hiroshi Mano, Numazu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/886,465

(22) Filed: Feb. 1, 2018

(65) Prior Publication Data
US 2018/0160544 A1    Jun. 7, 2018

Related U.S. Application Data

(63) Continuation of application No. 13/525,168, filed on Jun. 15, 2012, now Pat. No. 9,918,393.

(30) Foreign Application Priority Data

Jun. 29, 2011 (JP) .................................. 2011-144549
May 14, 2012 (JP) .................................. 2012-110924

(51) Int. Cl.
*H01L 41/04* (2006.01)
*H05K 3/34* (2006.01)
(Continued)

(52) U.S. Cl.
CPC .......... *H05K 3/3468* (2013.01); *H01L 41/04* (2013.01); *H01L 41/107* (2013.01);
(Continued)

(58) Field of Classification Search
USPC .................................................. 361/760, 761
See application file for complete search history.

(56) References Cited

U.S. PATENT DOCUMENTS 5,747,916 A    5/1998 Sugimoto
5,847,491 A    12/1998 Taihaku
(Continued)

FOREIGN PATENT DOCUMENTS

CN    1170944    1/1998
CN    101887891    11/2010
(Continued)

OTHER PUBLICATIONS

European Office Action dated Jun. 6, 2013 for corresponding European Appln. No. 12171430.7.
(Continued)

*Primary Examiner* — Andargie M Aychillhum
(74) *Attorney, Agent, or Firm* — Venable LLP

(57) ABSTRACT

A piezoelectric transformer includes a piezoelectric element. Two primary side electrodes exist on the primary side of the piezoelectric element. The primary side electrodes are coupled by a resistor formed from a conductive coating. A discharge current is discharged via the resistor to protect a semiconductor component from the discharge current. Since neither a short-circuit terminal nor conductive jig is required, electrostatic discharge damage to a semiconductor component can be prevented by a low-cost arrangement.

13 Claims, 10 Drawing Sheets

(51) Int. Cl.
*H05K 1/02* (2006.01)
*H01L 41/107* (2006.01)

(52) U.S. Cl.
CPC . *H05K 1/0259* (2013.01); *H05K 2201/10083* (2013.01); *H05K 2203/044* (2013.01); *H05K 2203/304* (2013.01); *Y10T 29/42* (2015.01)

(56) References Cited

U.S. PATENT DOCUMENTS

| | | | |
|---|---|---|---|
| 6,107,620 | A | 8/2000 | Shiba |
| 6,229,249 | B1 * | 5/2001 | Hatanaka ................ H03B 5/04 310/348 |
| 6,229,721 | B1 | 5/2001 | Mano |
| 7,265,479 | B2 | 9/2007 | Yamaguchi |
| 7,425,789 | B2 | 9/2008 | Yasukawa |
| 7,548,708 | B2 | 6/2009 | Nagasaki |
| 8,300,422 | B2 | 10/2012 | Nagasaki |
| 2003/0025587 | A1 | 2/2003 | Whitney |
| 2004/0265024 | A1 | 12/2004 | Naruse |
| 2007/0007855 | A1 | 1/2007 | Murata et al. |
| 2010/0290203 | A1 | 11/2010 | Nagasaki |
| 2011/0097100 | A1 | 4/2011 | Nagasaki |

FOREIGN PATENT DOCUMENTS

| | | |
|---|---|---|
| JP | 7-123715 | 5/1995 |
| JP | 2000-307166 | 11/2000 |
| JP | 2003-033017 | 1/2003 |
| JP | 2004-328948 | 11/2004 |
| JP | 2009-130311 | 6/2009 |
| JP | 2009-153293 | 7/2009 |
| WO | 2009/069590 | 6/2009 |

OTHER PUBLICATIONS

Chinese Office Action dated Nov. 24, 2014 for counterpart Chinese Appln. No. 2012-10214787.2.
Chinese Office Action dated Jun. 26, 2018 during prosecution of related Chinese application No. 201610132812.0. (Whole English-language translation included.).

* cited by examiner

FIG. 7

| BOARD SLIT DIMENSIONS | MAXIMUM TEMPERATURE RISE RATE[°C/sec] | PYROELECTRIC CURRENT [nA] | CONDITION OF RESISTANCE VALUE Rx OF RESISTOR |
|---|---|---|---|
| NONE | 0.6 | 8 | 1.9GΩ OR LESS |
| 1.5mm×8mm | 0.75 | 10 | 1.5GΩ OR LESS |
| 3mm×8mm | 0.8 | 11 | 1.4GΩ OR LESS |
| 15mm×4mm | 12 | 17 | 0.9GΩ OR LESS |

PRINTED CIRCUIT BOARD, POWER SUPPLY APPARATUS, IMAGE FORMING APPARATUS, AND PRINTED CIRCUIT BOARD MANUFACTURING METHOD

This application is a continuation of application Ser. No. 13/525,168, filed Jun. 15, 2012.

BACKGROUND OF THE INVENTION

Field of the Invention

The present invention relates to a printed circuit board on which a piezoelectric element is mounted, a power supply apparatus using the printed circuit board, and an image forming apparatus including the power supply apparatus.

Description of the Related Art

Flow soldering is known as a method of soldering an electronic component to an electronic device. The flow soldering method performs soldering by applying flux to a printed circuit board on which an electronic component is mounted, and dipping the board into a flow solder bath containing molten solder. More specifically, soldering is performed by forming a jet flow of molten solder (solder jet flow) in the flow solder bath, and bringing the board into contact with the top of the solder jet flow.

During preheating and passage through the flow solder bath in the flow soldering process, a piezoelectric transformer is heated to as high as several hundred degrees, and a high voltage is generated at the terminal owing to the pyroelectric effect. More specifically, a spark discharge occurs at a gap formed between a primary side terminal serving as the driving side of the piezoelectric transformer and a soldering land. A discharge voltage at this time reaches almost several hundred to several thousand V. To the contrary, the electrostatic breakdown voltage of the terminal of a semiconductor component such as an LSI or transistor is about several ten to several hundred V at most. When a discharge occurs due to the pyroelectric effect, a semiconductor component coupled to the extension of the soldering land at the primary side terminal of the piezoelectric transformer may break due to electrostatic dielectric breakdown.

Japanese Patent Laid-Open No. 2009-130311 proposes a method of arranging short-circuit terminals at two primary side terminals of a piezoelectric transformer and temporarily short-circuiting them by a conductive jig. This can suppress generation of a high voltage owing to the pyroelectric effect in the flow soldering process.

Japanese Patent Laid-Open No. 2000-307166 proposes a method of parallelly soldering a resistive element between the primary side terminals of a piezoelectric transformer, thereby suppressing generation of a high voltage owing to the pyroelectric effect. In this method, a pyroelectric current generated by the pyroelectric effect is discharged via the resistive element, reducing a voltage rise between the primary side terminals of the piezoelectric transformer. This suppresses a voltage applied to a semiconductor component coupled on the primary side of the piezoelectric transformer.

In the invention of Japanese Patent Laid-Open No. 2009-130311, the conductive jig needs to be reliably mounted between the primary side terminals to neither drop during flow soldering mounting nor cause a contact failure. Repetitive short-circuiting in a high-temperature environment requires a conductive jig which is excellent in heat resistance and durability and is easy to attach and detach. Depending on the conditions of the temperature and transfer speed in the flow soldering process, a pyroelectric voltage generated by the pyroelectric effect exceeds the electrostatic energy breakdown voltage of a semiconductor component. To prevent this, conditions to suppress the pyroelectric voltage need to be defined.

A resistive element described in Japanese Patent Laid-Open No. 2000-307166 is soldered to a circuit on a board only after passing through the flow solder bath in the soldering process. Hence, this method cannot satisfactorily suppress generation of a pyroelectric voltage upon an abrupt temperature rise of the piezoelectric element during preheating or passage through the flow solder bath in the soldering process. The electrodes of the primary side terminals of the piezoelectric transformer need to be reliably coupled before preheating and arrival at the flow solder bath.

SUMMARY OF THE INVENTION

The present invention solves the above problems. For example, the present invention prevents electrostatic discharge damage to a semiconductor component by reducing, by a low-cost reliable method, a pyroelectric voltage generated between the primary side terminals of a piezoelectric element owing to the pyroelectric effect in the flow soldering process.

According to the present invention, there is provided a printed circuit board soldered using a solder jet flow, comprising a piezoelectric element which is arranged on the printed circuit board and includes a conductive resistor that couples two electrodes arranged on a primary side of the piezoelectric element, and a semiconductor component which is arranged on the printed circuit board and drives the piezoelectric element.

Further features of the present invention will become apparent from the following description of exemplary embodiments (with reference to the attached drawings).

BRIEF DESCRIPTION OF THE DRAWINGS

FIG. 7 is a table showing the temperature rise rate, the pyroelectric current, and the condition of the resistance value Rx of a resistor when piezoelectric transformers are mounted by flow soldering using printed circuit boards different in the dimensions and position of the board slit;

DESCRIPTION OF THE EMBODIMENTS

Figure 1A:
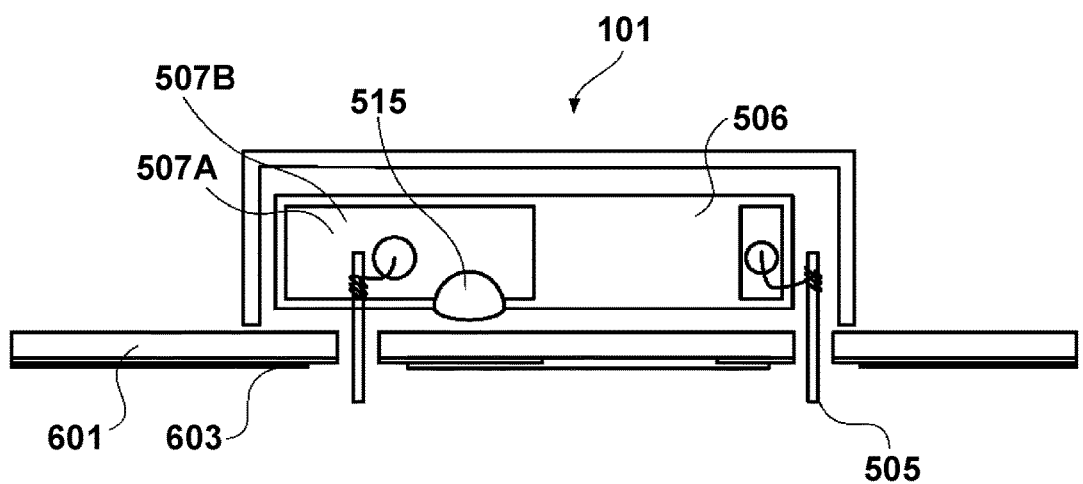
FIG. 1A is a sectional view showing a piezoelectric transformer fitted and inserted in a printed circuit board according to the first embodiment.

Preferred embodiments of the present invention will now be described. Individual embodiments to be described below would help understand the concept of the present invention. The technical scope of the present invention should be determined by the appended claims and is not limited to the following individual embodiments. Note that the same reference numerals denote common parts throughout the drawings and the specification to simplify the description.

[Basic Arrangement]

Figure 8:
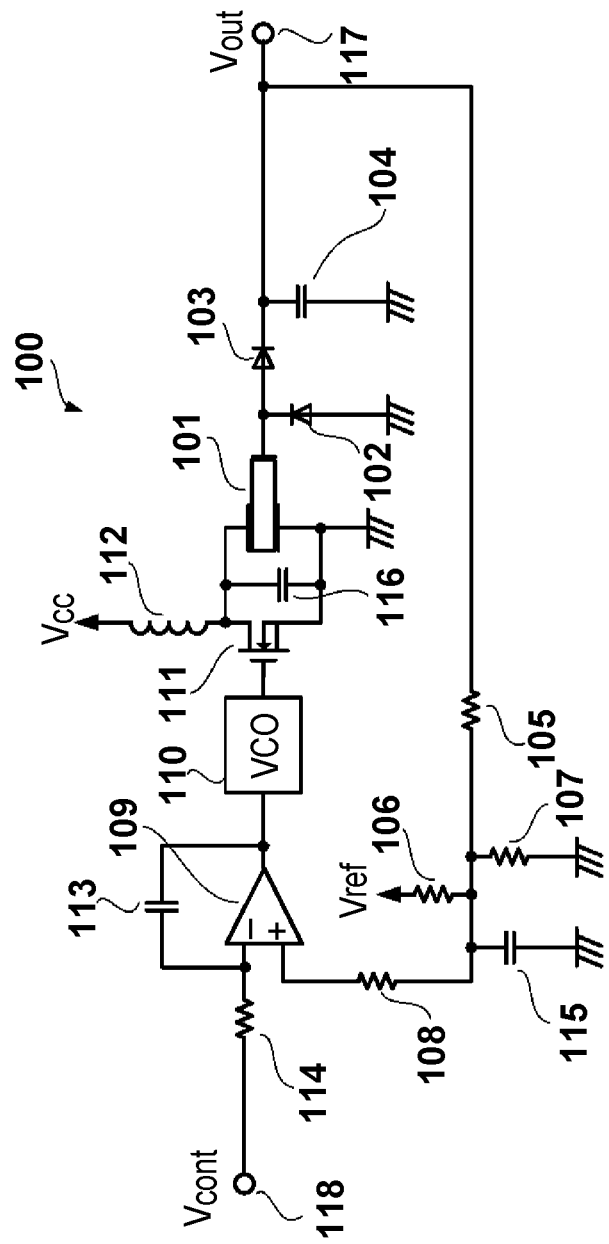
FIG. 8 is a circuit diagram showing a piezoelectric transformer type power supply apparatus used in an image forming apparatus.
Figure 11:
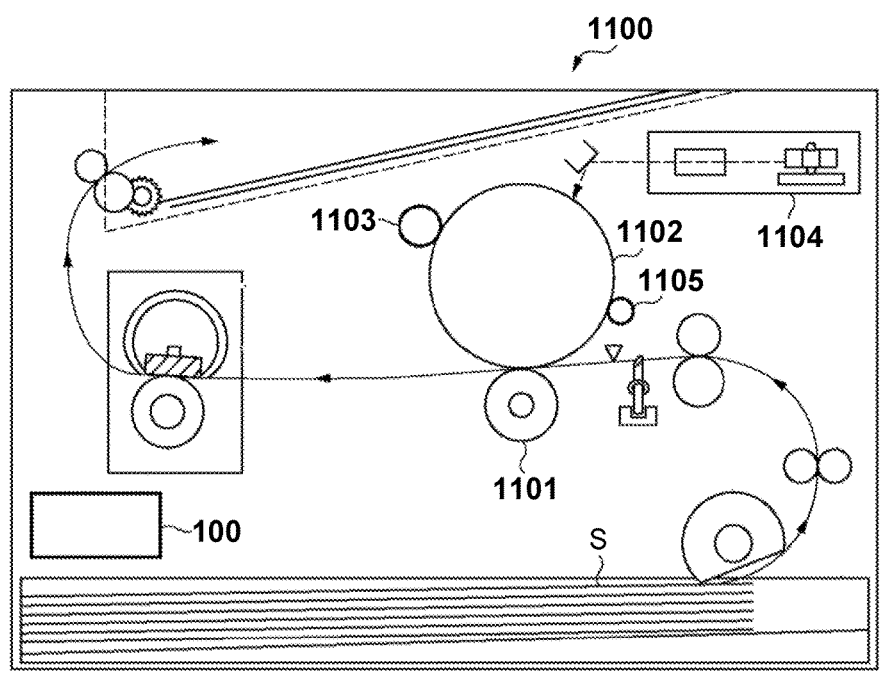
FIG. 11 is a sectional view exemplifying an image forming apparatus.

A power supply apparatus 100 which outputs a positive voltage will be described as an example of an electronic device with reference to FIG. 8. The power supply apparatus 100 is used in, for example, an electrophotographic image forming apparatus. FIG. 11 shows an image forming apparatus 1100. The power supply apparatus 100 supplies a transfer bias of a high voltage (voltage of several hundred V or more that is higher than a commercial power supply voltage) to the transfer roller of a transfer unit 1101 which transfers a toner image onto a printing medium S using the transfer bias. The power supply apparatus 100 may supply a charging bias to a charger 1103 which uniformly charges an image carrier 1102. The image forming apparatus 1100 includes an exposure device 1104 which exposes the image carrier 1102 charged by the charger 1103 in accordance with image information to form an electrostatic latent image, and a developing unit 1105 which develops the electrostatic latent image to form a toner image.

A piezoelectric transformer 101 is adopted instead of a conventional wire-wound electromagnetic transformer. A rectification smoothing circuit rectifies and smooths an output from the secondary side terminal of the piezoelectric transformer 101 into a positive voltage. The rectification smoothing circuit is formed from rectification diodes 102 and 103 and a high-voltage capacitor 104. The output voltage of the piezoelectric transformer 101 is output from an output terminal 117 coupled to a path extending from the piezoelectric transformer 101, and is supplied to a load (for example, the transfer roller of the transfer unit 1101). Note that the output voltage is divided by resistors 105, 106, and 107, and input into a capacitor 115 and into the non-inverting input terminal (positive terminal) of an operational amplifier 109 via a protection resistor 108.

The inverting input terminal (negative terminal) of the operational amplifier 109 receives, via a resistor 114, an analog signal (control signal (Vcont) of the power supply apparatus 100) that has been input from an input terminal 118. The operational amplifier 109, the resistor 114, and a capacitor 113 function as an integrating circuit. More specifically, the operational amplifier 109 receives the control signal Vcont which is smoothed in accordance with an integral time constant determined by the constants of the circuit components of the resistor 114 and capacitor 113. The output terminal of the operational amplifier 109 is coupled to a voltage-controlled oscillator (VCO) 110. The voltage-controlled oscillator 110 is an example of an oscillator which variably sets the frequency of an output signal in accordance with an input control signal.

The output terminal of the voltage-controlled oscillator 110 is coupled to the gate of a field-effect transistor 111. The field-effect transistor 111 is a switching element which is driven in accordance with an output signal from the oscillator, and is an example of a semiconductor component which drives a piezoelectric element. The drain of the field-effect transistor 111 is coupled via an inductor 112 to a power supply Vcc (for example, +24 V), and grounded via a capacitor 116. The inductor 112 is an element coupled between the switching element and the power supply, and is an example of an element having an inductance component to which a voltage is intermittently applied by driving the switching element. The drain is further coupled to one primary side electrode of the piezoelectric transformer 101. The other primary side electrode of the piezoelectric transformer 101 is grounded. The source of the field-effect transistor 111 is also grounded.

The voltage-controlled oscillator 110 switches the field-effect transistor 111 at a frequency corresponding to the output voltage of the operational amplifier 109. The inductor 112 and capacitor 116 form a resonance circuit. A voltage amplified by the resonance circuit is supplied to the primary side of the piezoelectric transformer 101. The piezoelectric transformer 101 is coupled to the node between the switching element and the element having an inductance component. Upon receiving a signal oscillating at a predetermined resonance frequency, the piezoelectric transformer 101 outputs a voltage corresponding to the frequency characteristics of the signal.

As described above, a plurality of semiconductor components such as the field-effect transistor 111, operational amplifier 109, and voltage-controlled oscillator (VCO) 110 are used to operate the piezoelectric transformer 101. In the piezoelectric transformer type power supply apparatus 100 used in an image forming apparatus or the like, a plurality of high-voltage generation circuits are often formed on one printed circuit board, and the wiring layout becomes very complicated in many cases.

A piezoelectric element used as the piezoelectric transformer 101 is manufactured by applying a strong DC electric field to a polycrystalline ferroelectric sintered at high temperature while heating the ferroelectric at several hundred degrees, thereby aligning electric dipoles in the ferroelectric in a predetermined direction. Owing to the properties of ferroelectricity, a dipole moment still remains even after the electric field is removed. At room temperature, the piezoelectric element has high piezoelectricity.

Figure 9:
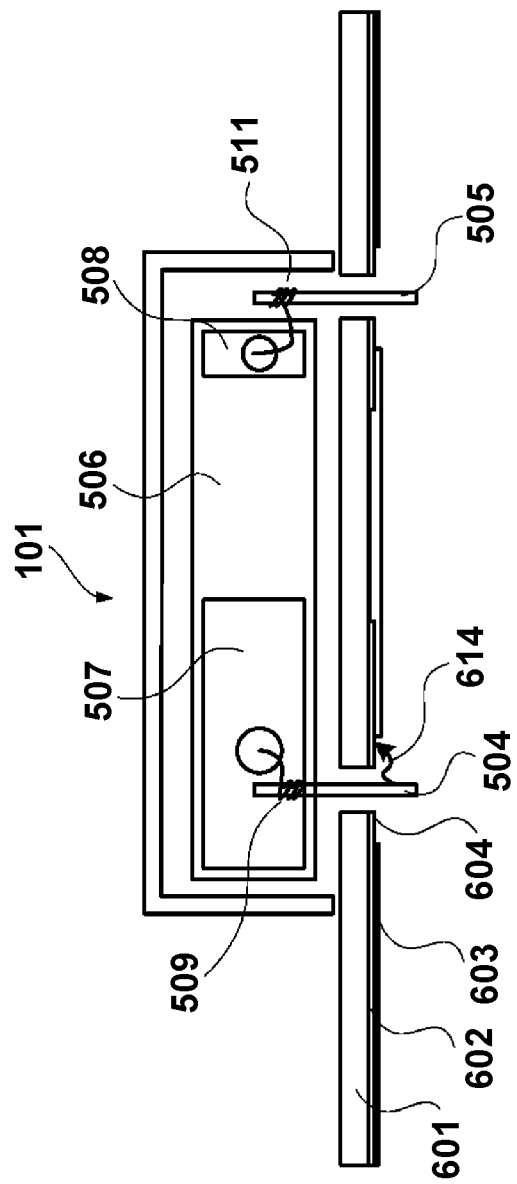
FIG. 9 is a sectional view showing a piezoelectric transformer fitted and inserted in a printed circuit board.

The structure of the piezoelectric transformer 101 shown in the sectional view of FIG. 9 is merely an example, and the piezoelectric element may have another structure. A primary side electrode 507 and secondary side electrode 508 are deposited on a piezoelectric element 506 with silver paste. The primary side electrode 507 and secondary side electrode 508 are coupled to a metal primary side terminal 504 and secondary side terminal 505 using gold filaments 509 and 511, respectively. These coupled portions are rendered conductive via solders.

A printed circuit board 210 will be explained by exemplifying a general single-layered paper phenol board. The paper phenol board includes a copper foil 602 and resist 603 serving as a wire on the surface of a paper phenolic resin plate 601. The paper phenol board has holes formed at coupling portions where component terminals and wiring portions are coupled. A soldering land 604 is formed around each hole to enable soldering. The soldering land 604 is formed by etching off the resist 603 to expose the copper foil 602.

As described above, when the printed circuit board bearing the piezoelectric transformer 101 is transferred to a flow solder bath, the piezoelectric element 506 serving as a piezoelectric ceramic element is heated by a heater used in preheating and the heat of a solder jet flow in the flow solder bath. Then, charges are generated at the primary side electrode 507 and secondary side electrode 508 of the heated piezoelectric element 506 owing to the pyroelectric effect. That is, a voltage is generated between the primary side terminal 504 and the secondary side terminal 505. The pyroelectric effect is a phenomenon in which electric polarization occurs upon heating or cooling a crystal. Spontaneous polarization occurs upon a temperature change of a pyroelectric member such as a piezoelectric element. If no temperature changes, polarization neutralizes. The polarization generates charges accumulated in electrodes attached to the two ends of the element.

If a gap (to be referred to as a discharge gap hereinafter) exists between the primary side terminal 504 and the soldering land 604, a high voltage generated by the pyroelectric effect acts as a spark discharge 614, which transfers through the gap. More specifically, charges move to the soldering land 604 and copper foil 602, abruptly changing the potential between the primary side terminal 504 and the soldering land 604.

Figure 10:
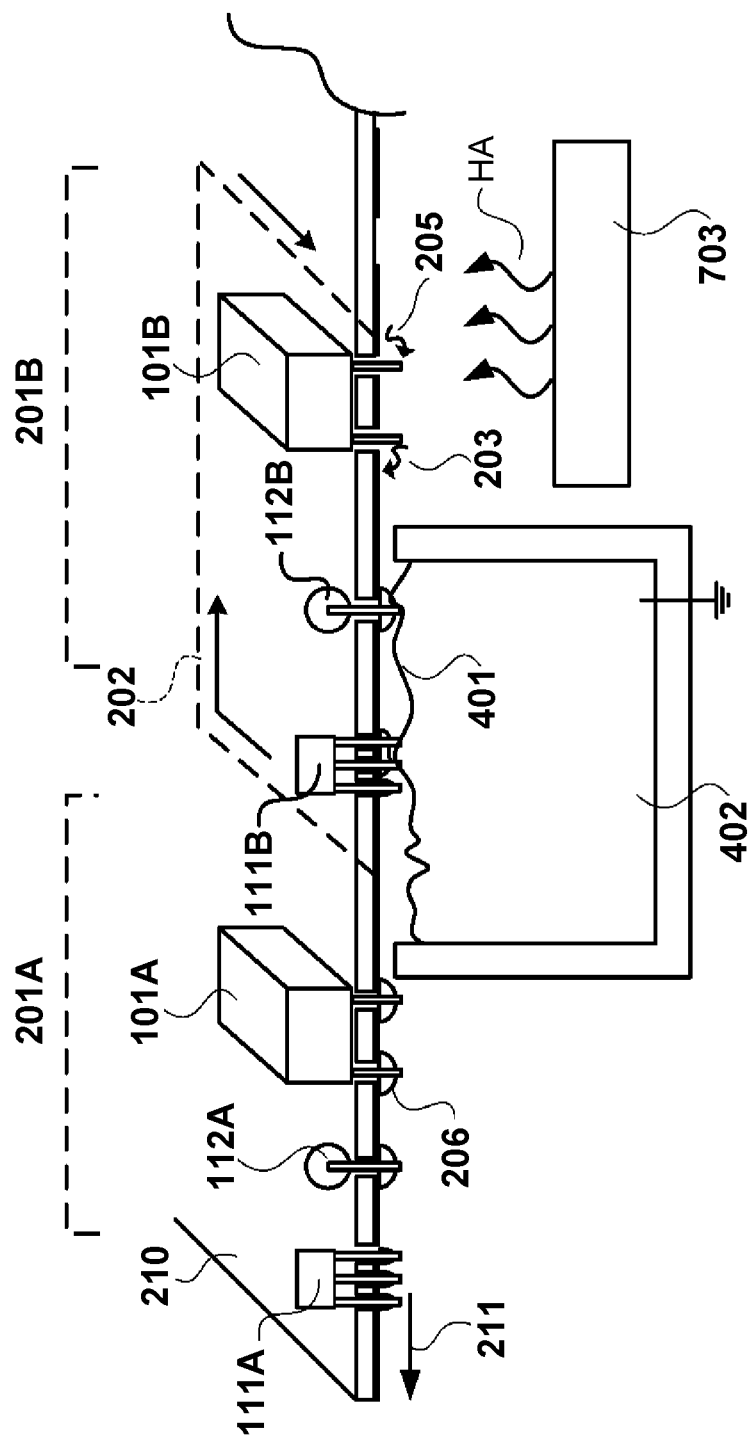
FIG. 10 is an enlarged view showing the vicinity of the primary side terminal of a piezoelectric transformer and the soldering land of a paper phenol board.

Referring to FIG. 10, piezoelectric transformers 101A and 101B, field-effect transistors 111A and 111B serving as semiconductor components, and inductors 112A and 112B are mounted in advance at predetermined positions on the printed circuit board 210 by an automatic fitting inserter or manual fitting insertion. In the flow soldering mounting process, the printed circuit board 210 is transferred in a travelling direction indicated by an arrow 211, and the above-mentioned electronic components are soldered using a solder jet flow. First, the printed circuit board 210 is preheated by a heater 703, and then passes through a solder jet flow 401 in a flow solder bath 402, thereby executing soldering.

Assume that a pattern for applying a reference potential to the piezoelectric transformers 101A and 101B and the pattern of the source terminals of the field-effect transistors 111A and 111B are coupled via a wire 202 on the printed circuit board 210, and have a common potential.

Assume that the piezoelectric transformer 101A, field-effect transistor 111A, and inductor 112A which belong to a circuit block 201A have already passed through the solder jet flow 401 and have undergone soldering 206. Also, assume that the field-effect transistor 111B and inductor 112B which belong to a circuit block 201B are passing through the solder jet flow 401. Further, assume that the piezoelectric transformer 101B which belongs to the circuit block 201B is being preheated before the solder jet flow.

If the piezoelectric transformer 101B during preheating is abruptly heated by hot air HA from the heater 703, an unsoldered terminal of the piezoelectric transformer 101B generates a spark discharge 203 toward the land owing to the pyroelectric effect. The charges (discharge current) of the spark discharge 203 are transmitted to the terminal of the inductor 112B and the land which are passing through the solder jet flow 401. Further, the charges of the spark discharge 203 are transmitted via the solder jet flow 401 to the gate terminal of the field-effect transistor 111B passing through the solder jet flow 401.

Note that the charges of the spark discharge 203 are transmitted to the gate terminal of the field-effect transistor 111B through various paths. As another example, if the field-effect transistor 111B has already been formed on the circuit, the charges of the spark discharge 203 are transmitted to the drain terminal of the field-effect transistor 111B via the circuit pattern. If the drain and gate terminals are coupled by the solder jet flow 401, the charges of the spark discharge 203 are transmitted to the gate terminal.

In this manner, the charges having passed through the field-effect transistor 111B are transmitted via the wire 202, acts as a spark discharge 205, and returns to the reference terminal of the piezoelectric transformer 101B. Through this route (discharge path), charges emerging from the piezoelectric transformer 101B move upon discharge. In the field-effect transistor 111B, the potential of the gate terminal abrupt rises with respect to the source terminal coupled to the reference potential of the printed circuit board 210. In general, the electrostatic energy breakdown voltage (also called electrostatic breakdown voltage or electrostatic tolerance) between the gate and source terminals is as low as several to several ten V. If the potential between the gate and source terminals based on the pyroelectric voltage exceeds the electrostatic energy breakdown voltage, the field-effect transistor 111B breaks due to dielectric breakdown.

As another model, even if a soldering land for the terminal of the piezoelectric transformer 101 is not directly coupled to a semiconductor component by a pattern, a discharge path may be formed via the solder jet flow 401. The flow solder bath 402 is generally grounded, and the solder jet flow 401 is also considered to be grounded in a broad sense. However, the reference potential of the printed circuit board 210 passing through the flow solder bath 402 floats unless the printed circuit board 210 is directly grounded or contacts the flow solder bath 402. Therefore, if a discharge occurs from the piezoelectric transformer 101 owing to the pyroelectric effect, the discharge current may flow through a lower-impedance pattern or component terminal, damaging even semiconductor components other than the field-effect transistor 111B.

To prevent this, the following embodiment will propose a method of defining conditions necessary to suppress a pyroelectric voltage generated due to the pyroelectric effect by a low-cost, simple method in the flow soldering process of a power supply apparatus, and protect a semiconductor component from damage.

The present invention is applicable to an electronic device other than the power supply apparatus as long as the electronic device includes the printed circuit board 210 on which the piezoelectric transformer 101 and semiconductor components are mounted. The present invention is also effective for a power supply apparatus which outputs either a positive or negative voltage. Here, a power supply apparatus which outputs a positive voltage will be exemplified.

In the present invention, a field-effect transistor will be exemplified as a target to be damaged by the pyroelectric effect. However, the following description will apply to even another semiconductor component.

Figure 1B:
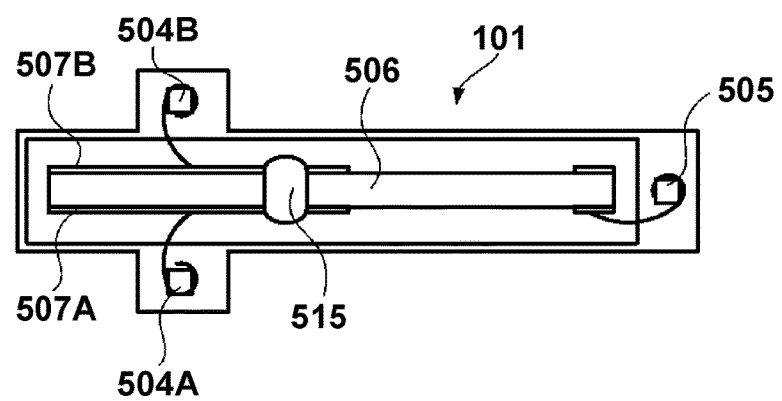
FIG. 1B is a view showing the bottom of the piezoelectric transformer fitted and inserted in the printed circuit board according to the first embodiment.

FIG. 1A shows the section of a piezoelectric transformer 101 used in the embodiment of the present invention. FIG. 1B shows the bottom of the piezoelectric transformer 101. Note that the same reference numerals as those described above denote the same parts to simply the description. In particular, a primary side electrode 507A coupled to a primary side terminal 504A of a piezoelectric element 506 and a primary side electrode 507B coupled to a primary side terminal 504B are coupled using a resistor 515. The piezoelectric element 506 includes the resistor 515 which is formed from a conductive coating and couples the two, primary side electrodes 507A and 507B arranged on the primary side. The primary side terminals 504A and 504B form a primary side electrode pair.

An arrangement including the resistor 515 will be explained in detail. An example of the resistor 515 is formed from a conductive coating prepared by mixing an epoxy resin using zinc oxide as a base. When manufacturing the piezoelectric transformer 101, the resistor 515 is applied between the primary side terminals and dried, and the resistor 515 has an initial resistance value within a given range. The piezoelectric transformer 101 including the resistor 515 is inserted into the printed circuit board 210 in the flow soldering process, and mounted by flow soldering.

Let Rx be the resistance value of the resistor 515. When a predetermined pyroelectric current is generated, a smaller resistance value Rx can decrease the pyroelectric voltage. That is, as the resistance value Rx increases, the pyroelectric voltage increases, raising the risk of electrostatic discharge damage to a semiconductor component. In contrast, when the power supply apparatus operates upon completion of flow soldering mounting, a larger resistance value Rx can reduce the loss in the primary side circuit of the piezoelectric transformer 101. An excessively small resistance value Rx increases the loss, failing to obtain satisfactory circuit characteristics. Hence, the resistance value Rx needs to be determined to meet all these requirements.

At this time, the resistance value Rx is not always equal to the above-mentioned initial resistance value. This is because the conductive coating prepared by mixing an epoxy resin using zinc oxide as a base changes the resistance value depending on a temperature change of the conductive coating itself. More specifically, when the temperature of the piezoelectric element 506 rises, that of the resistor 515 applied to the piezoelectric element 506 also rises, and the resistance value Rx increases. When the temperature is constant or decreases, the resistance value Rx does not change. The conductive coating prepared by mixing an epoxy resin using zinc oxide as a base is an example of the resistor. The characteristics and properties vary depending on a resistor used. The resistance value Rx of the resistor 515 is therefore determined in consideration of the characteristics of the resistor 515, especially a temperature change of the resistance value.

(1) Method of Obtaining Pyroelectric Voltage

A pyroelectric current Ip generated by the pyroelectric effect of the piezoelectric element 506 is given by $$Ip = P \cdot (A \cdot \Delta T / \Delta t) \quad (1.1)$$

where P is the pyroelectric coefficient [C/(m$^2$·° C.)], A is the area [m$^2$] of the primary side electrode of the piezoelectric element, and $\Delta T/\Delta t$ is a temperature change [° C./sec] of the piezoelectric element 506 per unit time (to be referred to as a temperature rise rate). The pyroelectric coefficient P is a numerical value indicating the degree of polarization change given by a unit temperature change per unit area. As the numerical value of the pyroelectric coefficient P is larger, the motion of charges in the piezoelectric element 506 along with a temperature change becomes more active.

A pyroelectric voltage Vp generated between the primary side electrodes 507A and 507B of the piezoelectric element 506 is given using the resistance value Rx of the resistor 515 and the pyroelectric current Ip:

$$Vp = Ip \cdot Rx \quad (1.2)$$

As represented by this equation, the pyroelectric voltage Vp is the product of the pyroelectric current Ip which is generated by the piezoelectric element 506 owing to the pyroelectric effect in the soldering process using a solder jet flow, and the resistance value Rx of the resistor 515. Substituting equation (1.1) into equation (1.2) yields $$Vp = P \cdot (A \cdot \Delta T / \Delta t) \cdot Rx \quad (1.3)$$

As is apparent from equation (1.3), four methods are conceivable as a method of reducing the pyroelectric voltage Vp. The first method decreases the pyroelectric coefficient P. The second method decreases the area A of the primary side electrode of the piezoelectric element 506. The third method decreases the temperature rise rate $\Delta T/\Delta t$. The fourth method decreases the resistance value Rx.

The first method of decreasing the pyroelectric coefficient P can be implemented by increasing the heat capacity of the piezoelectric element 506. However, a larger volume of the piezoelectric element 506 increases the component dimensions and raises the cost. If the component composition is changed, the characteristics may be greatly changed. The second method of decreasing the area A of the primary side electrode of the piezoelectric element 506 impairs the boosting ability of the piezoelectric element 506. Thus, the second method is not suitable for a circuit which requires high boosting ability. In contrast, the third method of decreasing the temperature rise rate $\Delta T/\Delta t$ of the piezoelectric element 506, and the fourth method of decreasing the resistance value Rx of the resistor 515 can be implemented relatively easily.

The temperature rise rate $\Delta T/\Delta t$ of the piezoelectric element 506 changes depending on a parameter. Examples of the parameter are the temperature settings of the heater 703 and flow solder bath 402 and the transfer speed of the printed circuit board 210 which are condition settings in the flow soldering process. Parameters for changing the temperature rise rate $\Delta T/\Delta t$ also include the arrangement position of the piezoelectric transformer 101 on the printed circuit board 210, and the presence/absence, position, and dimensions of a board slit.

(2) Method of Obtaining Application Voltage to Field-Effect Transistor

A method of obtaining a margin for electrostatic discharge damage to the field-effect transistor 111 when the gate and drain of the field-effect transistor 111 are coupled by the solder jet flow 401 in the flow solder bath 402 will be explained. At this time, discharge energy Ep by the pyroelectric effect is obtained based on the pyroelectric voltage Vp generated by the pyroelectric effect of the piezoelectric element 506. Then, an application voltage when the discharge energy Ep is supplied to the field-effect transistor 111 is obtained. Further, the electrostatic energy breakdown voltage between the gate and source of the field-effect transistor 111 and the application voltage are compared with each other.

The discharge energy Ep by the pyroelectric effect of the piezoelectric element 506 is given by $$Ep = ((C1+C2) \cdot Vp2)/2 \qquad (1.4)$$

where C1 is the capacitance [pF] of the primary side terminals 504A and 504B of the piezoelectric element 506, and C2 is the capacitance [pF] of the capacitor 116 mounted parallel to the primary side capacitance of the piezoelectric element 506 on the printed circuit board 210. In general, both C1 and C2 are about several hundred to several thousand pF.

Electrostatic energy Egs between the gate and source of the field-effect transistor 111 is given by $$Egs = Ciss \cdot Vgs2/2 \qquad (1.5)$$

where Vgs is the application voltage [V] between the gate and source of the field-effect transistor 111, and Ciss is the capacitance [pF] between the gate and source of the field-effect transistor 111. In general, Ciss is about 100 pF. The discharge energy Ep generated from the piezoelectric element 506 and the electrostatic energy Egs of the field-effect transistor 111 become equal to each other in the application model of the pyroelectric voltage Vp in the embodiment:

$$Egs = Ep \qquad (1.6)$$

Substituting equations (1.4) and (1.5) into equation (1.6) yields $$Ciss \cdot Vgs2 = (C1+C2) \cdot Vp2 \qquad (1.7)$$

Accordingly, an application voltage Vgs between the gate and source of the field-effect transistor 111 can be given by $$Vgs = Vp \sqrt{\frac{C1+C2}{Ciss}} \qquad (1.8)$$

$$Vgs = P \times \left(A \times \frac{\Delta T}{\Delta t}\right) \times Rx \times \sqrt{\frac{C1+C2}{Ciss}} \qquad (1.9)$$

In this fashion, the application voltage Vgs is determined by the pyroelectric voltage Vp, the capacitance (C1+C2) between the two electrodes arranged on the primary side of the piezoelectric element 506, and the capacitance Ciss of the semiconductor component.

(3) Conditional Expressions to Prevent Electrostatic Discharge Damage to Field-Effect Transistor To prevent electrostatic discharge damage to the field-effect transistor 111, the application voltage Vgs between the gate and the source by the pyroelectric effect suffices to be equal to or lower than the electrostatic energy breakdown voltage between the gate and source of the field-effect transistor 111. That is, it suffices to satisfy the relation:

$$Ve \geq Vgs \qquad (1.10)$$

Relation (1.10) is rewritten into $$Ve \geq P \cdot \left(A \cdot \frac{\Delta T}{\Delta t}\right) \cdot Rx \cdot \sqrt{\frac{C1+C2}{Ciss}} \qquad (1.11)$$

Relation (1.11) is rewritten into the equation of the resistance value Rx of the resistor 515:

$$Re \leq Ve \bigg/ \left(P \cdot \left(A \cdot \frac{\Delta T}{\Delta t}\right) \cdot Rx \cdot \sqrt{\frac{C1+C2}{Ciss}}\right) \qquad (1.12)$$

The resistance value Rx of the resistor 515 is obtained to satisfy relation (1.12). The right-hand side of relation (1.12) indicates the upper limit value of the resistance value Rx. That is, the upper limit value of the resistance value Rx of the resistor 515 is designed so that the application voltage Vgs applied to the semiconductor component becomes equal to or lower than the electrostatic energy breakdown voltage Ve of the semiconductor component in proportion to the pyroelectric voltage Vp generated in the pyroelectric effect owing to the pyroelectric effect in the soldering process using a solder jet flow. A larger resistance value Rx moderates the condition. An excessively small resistance value Rx increases the loss on the primary side of the piezoelectric element 506. From this, the lower limit condition of the resistance value Rx is determined depending on the loss permitted on the primary side of the piezoelectric element 506.

As represented by relation (1.12), the resistance value Rx of the resistor 515 is determined based on the temperature conditions of the heater 703 and solder jet flow 401 and the transfer speed of the printed circuit board 210 in the flow soldering process. The resistance value Rx of the resistor 515 is also determined by the capacitance C2 of the capacitor 116 coupled to the primary side terminals 504A and 504B of the piezoelectric element 506. It is advantageous to use a field-effect transistor 111 having a higher electrostatic energy breakdown voltage Ve.

To satisfy the above relations, it is effective to perform the following confirmation in the flow soldering process. The surface temperature of the piezoelectric element 506 is measured, and a temperature change per unit time is obtained as the temperature rise rate ΔT/Δt from the surface temperature measurement result.

Figure 2:
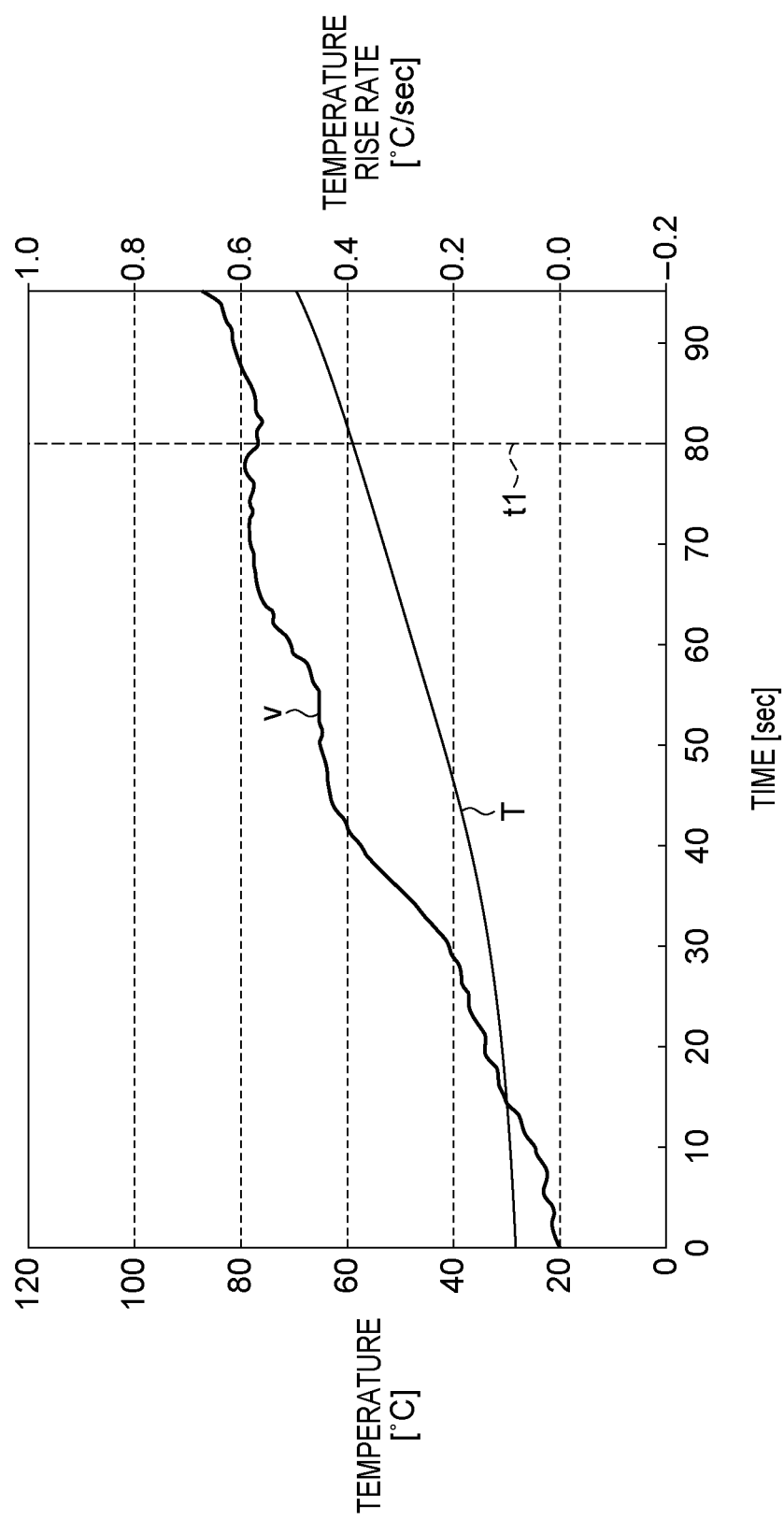
FIG. 2 is a graph showing the surface temperature and temperature rise rate of a piezoelectric element.

FIG. 2 shows changes of the surface temperature T and temperature rise rate v of the piezoelectric element 506 till the completion of passing through the flow solder bath after preheating. A broken line indicates timing t1 when the primary side terminals 504A and 504B of the piezoelectric element 506 enter the solder jet flow 401.

The temperature rise rate v maximizes after timing t1 when the primary side terminals 504A and 504B of the piezoelectric element 506 enter the solder jet flow 401. After timing t1, peripheral electrical components including the primary side terminals 504A and 504B of the piezoelectric transformer 101 have already been soldered and mounted on the board pattern. After timing t1, a path capable of sufficiently discharging a pyroelectric current has been formed. This means that a discharge large enough to electrostatically damage the field-effect transistor 111 does not occur. Hence, the temperature rise rate v at and before timing t1 when the piezoelectric element 506 enters the solder jet flow 401 is considered.

More specifically, the constants of the respective capacitances are set to C1=500 pF, C2=470 pF, and Ciss=140 pF. The pyroelectric current Ip obtained from the maximum value of the temperature rise rate v before timing t1 is set to 8 nA. Further, the electrostatic energy breakdown voltage Ve between the gate and source of the field-effect transistor 111 is set to 40 V. Substituting these values into relation (1.12) yields $$Rx \le 40 \text{ V} \Big/ \left( 8 \text{ nA} \cdot \sqrt{\frac{500 \text{ pF} + 470 \text{ pF}}{140 \text{ pF}}} \right) \quad (1.13)$$

$$Rx \le 1900 \text{ M}\Omega \quad (1.14)$$

The resistance value Rx of the resistor 515 needs to satisfy the condition of relation (1.14) even when it increases along with a temperature rise in the flow soldering process. In other words, the resistance value Rx is determined in consideration of the resistance rise. For example, if the resistance value increases by 200 MΩ upon a temperature rise of the resistor 515 itself, the initial resistance value of the resistor 515 needs to be set to 1,700 MΩ or less. In this way, the initial resistance value of the resistor 515 is designed by subtracting, as a margin from the upper limit value, an increase of the resistance value upon a temperature rise of the resistor 515 in the soldering process. This can prevent electrostatic discharge damage to the field-effect transistor 111 caused by the pyroelectric effect.

As described above, the resistor 515 is formed from a conductive coating between the primary side electrodes 507A and 507B of the primary side terminals 504A and 504B of the piezoelectric element 506. Thus, no short-circuit terminal need be arranged, and no conductive jig need be attached to the short-circuit terminal, unlike Japanese Patent Laid-Open No. 2009-130311. In Japanese Patent Laid-Open No. 2000-307166, a resistive element is soldered to the primary side terminal of a piezoelectric element, so electrostatic discharge damage to a semiconductor component cannot be satisfactorily prevented. To the contrary, the embodiment can omit soldering because the resistor 515 is formed from a conductive coating between the primary side electrodes 507A and 507B of the piezoelectric element 506. More specifically, the resistor 515 is formed before the printed circuit board 210 enters the solder jet flow 401. Thus, the embodiment is superior to the invention disclosed in Japanese Patent Laid-Open No. 2000-307166 in prevention of electrostatic discharge damage to a semiconductor component. The embodiment can prevent electrostatic discharge damage to a semiconductor component by reliably reducing at low cost a pyroelectric voltage generated between the primary side terminals of a piezoelectric element owing to the pyroelectric effect in the flow soldering process.

In the embodiment, the resistance value Rx of the resistor 515 is determined so that the application voltage Vgs between the gate and source of a semiconductor component based on discharge energy becomes equal to or lower than the electrostatic energy breakdown voltage Ve of the semiconductor component. Note that the application voltage Vgs is determined from the temperature rise rate ΔT/Δt of the piezoelectric element 506 itself.

Since the resistance value Rx of the resistor 515 increases depending on the temperature, it is important to manage the initial resistance value. If a material less dependent on the temperature is selected as the material of the resistor 515, the necessity to consider a rise of the resistance value based on the temperature can be reduced. In other words, a large initial resistance value of the resistor 515 can be set to reduce the loss of power by the resistor 515.

As one method of further moderating the condition of the resistance value Rx, it is effective to decrease the temperature rise rate. For example, the temperature setting of the flow solder bath 402 is decreased, or the transfer speed of the printed circuit board 210 is decreased.

The embodiment employs a model of the piezoelectric transformer 101 and semiconductor component which form one circuit on the printed circuit board 210. However, the same effects as those in the embodiment can be obtained for a printed circuit board 210 on which at least one piezoelectric transformer 101 and at least one semiconductor component exist. This is because it suffices to arrange the resistor 515 on each of a plurality of piezoelectric transformers 101 when a plurality of piezoelectric transformers 101 and a plurality of semiconductor components exist.

The embodiment will examine a case in which the potential difference between a board pattern including the primary side terminal 504 of the piezoelectric transformer 101 and a board pattern including the secondary side terminal 505 is large. In this case, a board slit is formed in the printed circuit board 210 at a position in contact with the piezoelectric element 506. By defining the dimensions and position of the board slit, the embodiment suppresses temperature rises of the piezoelectric element 506 and resistor 515 in the flow soldering process, and reduces the pyroelectric voltage.

Figure 3:
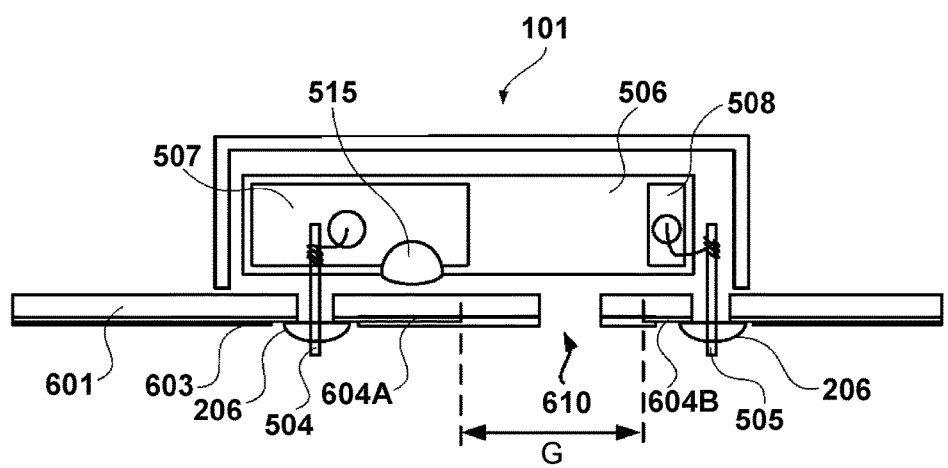
FIG. 3 is a sectional view showing a piezoelectric transformer fitted and inserted in a printed circuit board according to the second embodiment.

First, a purpose of arranging the board slit will be explained with reference to FIG. 3. FIG. 3 shows a board slit 610 which is formed between the primary side terminal 504 and the secondary side terminal 505 in the sectional view of the piezoelectric transformer 101 shown in FIG. 1. The embodiment describes a pyroelectric current generated in the primary side terminal 504. If the board slit 610 is formed at a position in contact with the primary side terminal 504, it increases the pyroelectric current. Further, the board slit 610 affects even the temperature of the resistor 515 arranged at the primary side terminal 504.

To prevent leakage, it is necessary to appropriately ensure a distance G between the secondary side terminal 505 of the piezoelectric transformer 101 which outputs a high voltage of several hundred to several thousand V, and a land 604B or pattern including the secondary side terminal 505, and the primary side terminal 504 coupled between ground GND and an input voltage circuit of several ten to several hundred V, and a land 604A or pattern including the primary side terminal 504. If the potential difference between the primary and secondary sides of the piezoelectric transformer 101 is excessively large, the distance G between the primary side terminal 504 and the secondary side terminal 505 is sometimes insufficient as a leakage preventing distance. In this case, the board slit 610 is generally formed between the lands.

Figure 4A:
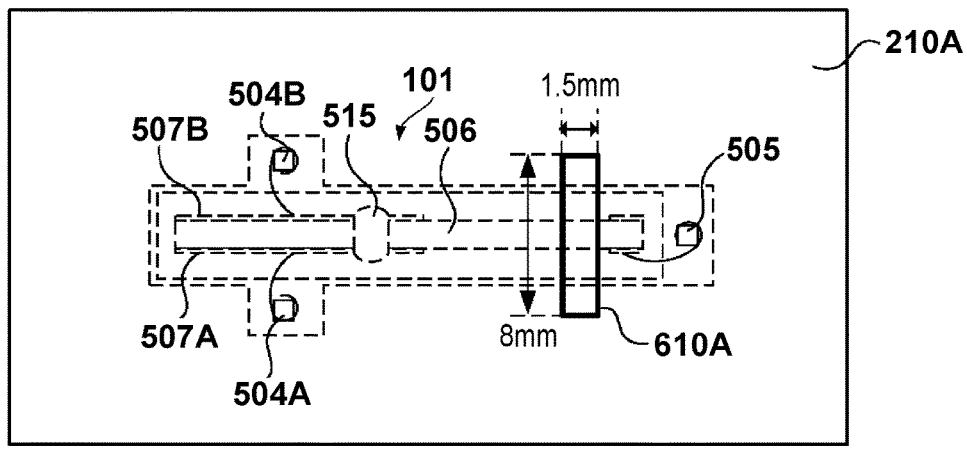
FIG. 4A is a perspective view showing the dimensions and position of a board slit near the piezoelectric transformer according to the second embodiment when viewed from the solder surface of a printed circuit board.
Figure 4B:
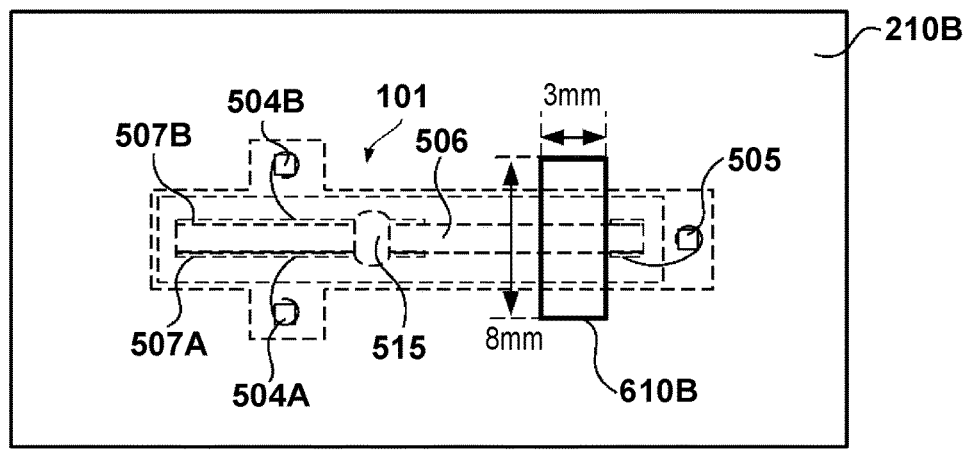
FIG. 4B is a perspective view showing the dimensions and position of a board slit near the piezoelectric transformer when viewed from the solder surface of a printed circuit board.
Figure 4C:
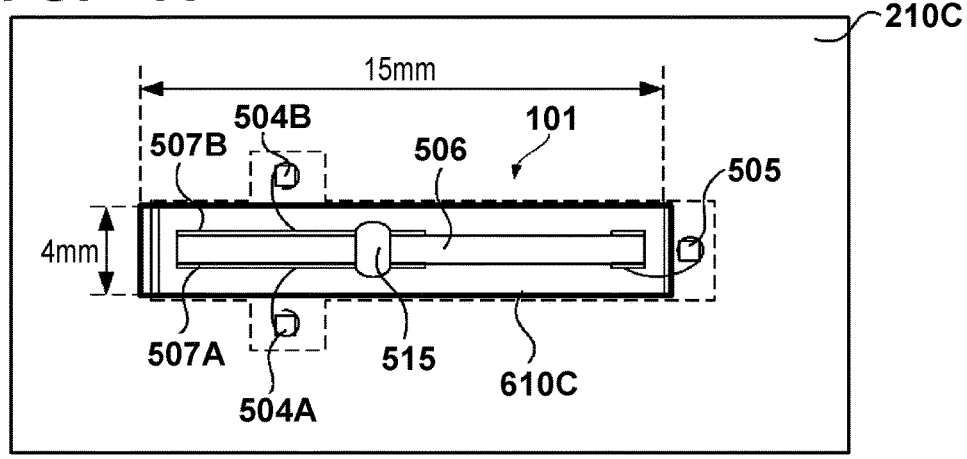
FIG. 4C is a perspective view showing the dimensions and position of a board slit near the piezoelectric transformer when viewed from the solder surface of a printed circuit board.

FIGS. 4A to 4C are perspective views showing the piezoelectric transformer 101 described with reference to FIG. 3 when viewed from the solder surface of the printed circuit board 210. In FIGS. 4A to 4C, the board slit 610 has different dimensions and positions. More specifically, in FIG. 4A, a 1.5 mm×8 mm board slit 610A is formed near the secondary side terminal 505 of the piezoelectric element 506 in a printed circuit board 210A. In FIG. 4B, a 3 mm×8 mm board slit 610B is formed near the secondary side terminal 505 of the piezoelectric element 506 in a printed circuit board 210B. In FIG. 4C, a 15 mm×4 mm board slit 610C is formed on the entire surface of the piezoelectric element 506 in a printed circuit board 210C.

As shown in FIGS. 4A to 4C, the primary side electrodes 507A and 507B are deposited on two facing surfaces of the piezoelectric element 506 on the primary side. Also, the resistor 515 is formed from a conductive coating to couple the primary side electrodes 507A and 507B.

Figure 5:
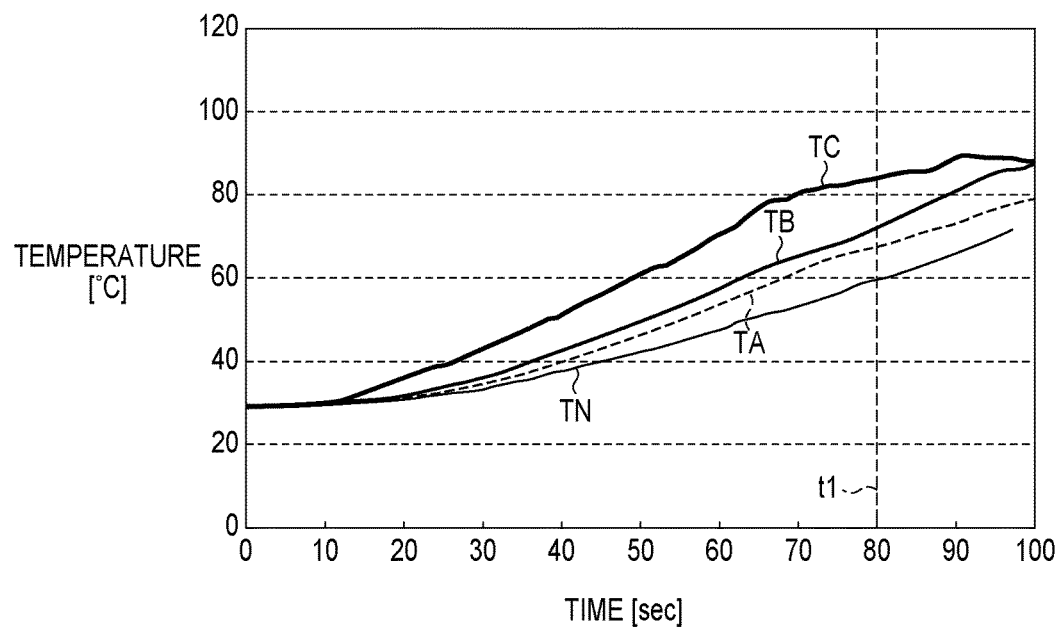
FIG. 5 is a graph showing the surface temperatures of respective piezoelectric elements when piezoelectric transformers are mounted by flow soldering using printed circuit boards different in the dimensions and position of the board slit.

FIG. 5 is a graph showing the surface temperatures of respective piezoelectric elements 506 when the printed circuit boards 210A, 210B, and 210C using the three board slits 610A, 610B, and 610C different in shape, and the printed circuit board 210 having no board slit are mounted by the flow soldering process under the same conditions. In FIG. 5, TN is the surface temperature of the piezoelectric element 506 on the printed circuit board 210 having no board slit. TA is the surface temperature of the piezoelectric element 506 when the board slit 610A shown in FIG. 4A is used. TB is the surface temperature of the piezoelectric element 506 when the board slit 610B shown in FIG. 4B is used. TC is the surface temperature of the piezoelectric element 506 when the board slit 610C shown in FIG. 4C is used. A broken line indicates timing t1 when the primary side terminal 504 of the piezoelectric element 506 enters the solder jet flow 401.

As is apparent from FIG. 5, as the dimensions of the board slit 610 are larger, the surface temperature of the piezoelectric element 506 is more greatly affected by preheating, and the temperature tends to rise much more. After the piezoelectric element 506 passes through the solder jet flow 401, the piezoelectric element 506 having no board slit 610 or the small-dimension board slit 610A or 610B tends to increase the temperature, compared to the piezoelectric element 506 having the larger-dimension board slit 610C. This is because the board slit 610 has a cooling effect.

Figure 6:
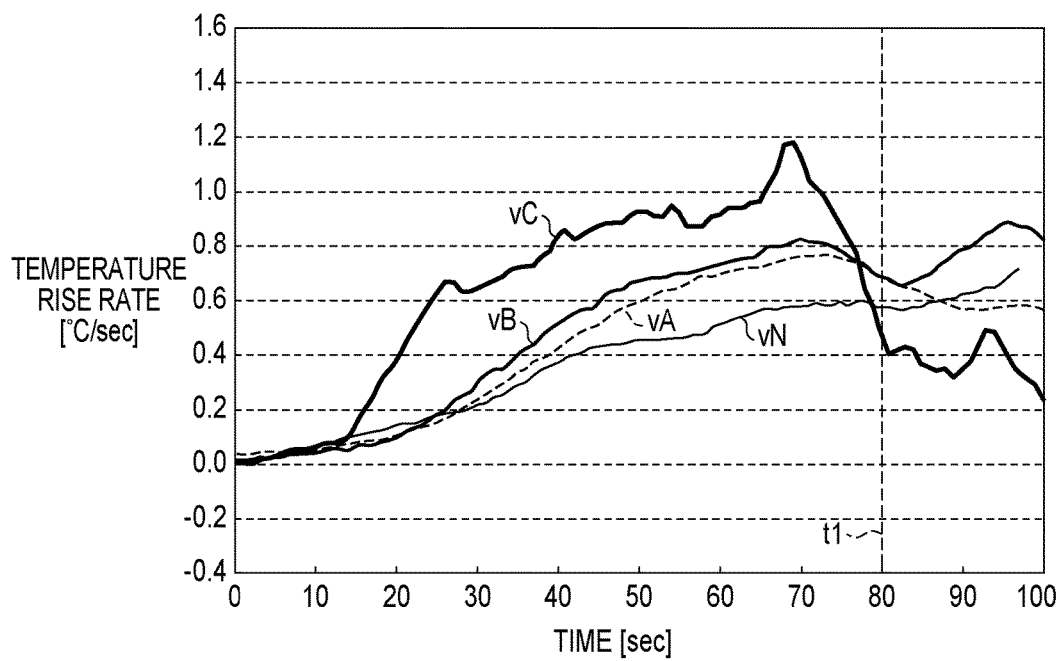
FIG. 6 is a graph showing the temperature rise rates of respective piezoelectric elements when piezoelectric transformers are mounted by flow soldering using printed circuit boards different in the dimensions and position of the board slit.

FIG. 6 shows temperature rise rates obtained by calculating temperature changes per unit time based on the surface temperature measurement results of the piezoelectric elements 506 at different board slit dimensions shown in FIG. 5. In FIG. 6, vN is the temperature rise rate of the piezoelectric element 506 on the printed circuit board 210 having no board slit. vA is the temperature rise rate of the piezoelectric element 506 when the board slit 610A shown in FIG. 4A is used. vB is the temperature rise rate of the piezoelectric element 506 when the board slit 610B shown in FIG. 4B is used. vC is the temperature rise rate of the piezoelectric element 506 when the board slit 610C shown in FIG. 4C is used. A broken line indicates timing t1 when the primary side terminal of the piezoelectric element 506 enters the solder jet flow 401.

FIG. 6 reveals that the temperature rise rate vC corresponding to the largest-dimension board slit 610C is prominently high. As the dimensions of the board slit 610 decrease, the temperature rise rate decreases. If the surface temperature of the piezoelectric element 506 rises, the temperature of the resistor 515 applied to the piezoelectric element 506 also rises. When such a conductive coating as to increase the resistance value Rx along with a temperature rise of the resistor 515 is used, the pyroelectric voltage Vp also increases proportionally.

FIG. 7 shows a maximum temperature rise rate before timing t1, the pyroelectric current Ip, and the resistance value Rx calculated from relation (1.12) upon flow soldering mounting using the board slits 610A to 610C. For example, assume that the constants of the respective capacitances are C1=500 pF, C2=470 pF, and Ciss=140 pF, and the electrostatic energy breakdown voltage Ve between the gate and source of the field-effect transistor 111 is 40 V.

As is apparent from FIG. 7, the condition of the resistance value Rx of the resistor greatly changes depending on the dimensions of the board slit 610. Especially for the board slit 610C which covers the entire piezoelectric element 506, as shown in FIG. 4C, the condition of the resistance value Rx becomes extremely strict. When the resistance value Rx increases upon a temperature rise of the resistor 515 itself, the resistance value also increases greatly. For example, if the resistance increases by 400 MΩ for the board slit 610B shown in FIG. 4B, a necessary initial resistance value condition is 1,000 MΩ or less. If the resistance increases by 600 MΩ for the board slit 610C shown in FIG. 4C, a necessary initial resistance value condition becomes 300 MΩ or less. However, an excessively small resistance value Rx increases the loss on the primary side of the piezoelectric element 506, as described above. Even the lower limit condition of the resistance value Rx needs to be taken into account.

In this manner, larger dimensions of the board slit 610 make management conditions more strict in the manufacture of the resistor 515. When the resistor 515 is formed from a conductive coating as in the embodiment, management conditions such as the application amount of the conductive coating to the piezoelectric element 506 would become strict.

From the above discussion, when the board slit 610 is formed at a position in contact with the piezoelectric element 506, its dimensions need to be minimized. In addition, the board slit 610 is formed at a position not in contact with the primary side terminal 504 or resistor 515 of the piezoelectric element 506, that is, at a position near the secondary side terminal 505 of the piezoelectric element 506. Arranging the board slit 610 at a position shifted from the arrangement position of the primary side terminal 504 of the piezoelectric element 506 enhances the effect of reducing the pyroelectric voltage Vp arising from temperature rises of the piezoelectric element 506 and resistor 515.

The embodiment has been described using a rectangular board slit for descriptive convenience. However, the above description also applies to a board slit having another shape or a plurality of board slits. The conductive coating has been explained as the resistor 515 which couples the primary side electrodes 507A and 507B of the primary side terminal 504 of the piezoelectric element 506. However, the above description also applies to a conductive coating having a resistance value.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-144549 filed Jun. 29, 2011 and 2012-110924 filed May 14, 2012, which are hereby incorporated by reference herein in their entirety.

What is claimed is:

1. A printed circuit board comprising:
a piezoelectric element mounted on the printed circuit board and including a primary side electrode pair configured to input a voltage, a secondary side electrode configured to generate an output voltage according to the input voltage to the primary side electrode pair and a conductive resistor that couples the primary side electrode pair;
a first connection part connected to the primary side electrode pair of the piezoelectric element;
a second connection part connected to the secondary side electrode of the piezoelectric element; and
an opening provided to the printed circuit board arranged between the first connection part and the second connection part so as to prevent an occurrence of leakage between the first connection part and the second connection part, the opening passing through the printed circuit board,
wherein the conductive resistor is arranged between the first connection part and the opening when viewed from a direction perpendicular to the printed circuit board.

2. The printed circuit board according to claim 1, further comprising:
a first electrically conductive pattern connected to the first connection part; and
a second electrically conductive pattern connected to the second connection part,
wherein the opening is arranged between the first electrically conductive pattern and the second electrically conductive pattern.

3. The printed circuit board according to claim 2, wherein both the first electrically conductive pattern and the second electrically conductive pattern are formed on a surface of the printed circuit board on a back side of a surface of the printed circuit board on which the piezoelectric element is mounted.

4. The printed circuit board according to claim 1, further comprising:
a field-effect transistor connected to the primary side electrode pair of the piezoelectric element; and
a capacitor connected to the primary side electrode pair of said piezoelectric element in parallel,
wherein a resistance value of the conductive resistor is configured based on a capacitance between the primary side electrode pair of the piezoelectric element, a capacitance between a source and a gate of the field-effect transistor, and a withstand voltage between the source and the gate of the field-effect transistor, and a capacitance of the capacitor.

5. The printed circuit board according to claim 1, wherein the conductive resistor reduces a current due to a pyroelectric voltage generated by the piezoelectric element owing to a heat from a soldering process of the piezoelectric element by conveying the board into the solder jet flow.

6. The printed circuit board according to claim 1, wherein the conductive resistor is a resistor formed by a conductive coating.

7. A power supply apparatus comprising:
a printed circuit board including:
a piezoelectric element mounted on the printed circuit board and including a primary side electrode pair configured to input a voltage, a secondary side electrode configured to generate an output voltage according to the input voltage to the primary side electrode pair, and a conductive resistor that couples the primary side electrode pair;
a first connection part connected to the primary side electrode pair of the piezoelectric element;
a second connection part connected to the secondary side electrode of the piezoelectric element; and
an opening arranged between the first connection part and the second connection part so as to prevent an occurrence of leakage between the first connection part and the second connection part, the opening passing through the printed circuit board,
wherein the conductive resistor is arranged between the first connection part and the opening when viewed from a direction perpendicular to the printed circuit board;
a semiconductor component mounted on the printed circuit board and connected to the piezoelectric element; and
a rectifying and smoothing circuit configured to rectify and smooth the voltage output by the secondary side electrode.

8. The power supply apparatus according to claim 7, wherein the semiconductor component is a field-effect transistor, and
the power supply apparatus further comprising a control unit configured to output a signal for driving the field-effect transistor,
wherein the control unit is further configured to control the voltage output from the secondary side electrode of the piezoelectric element by changing a frequency of the signal.

9. The power supply apparatus according to claim 8, further comprising a detection circuit configured to detect a voltage rectified and smoothed by the rectifying and smoothing circuit,
wherein control unit is further configured to control the frequency of the signal based on a voltage detected by the detection circuit.

10. An image forming apparatus comprising:
an image carrier;
an image forming unit configured to form an image on the image carrier; and
a power supply configured to supply a voltage to the image forming unit;
wherein the power supply includes:
a printed circuit board including:
a piezoelectric element mounted on the printed circuit board and including a primary side electrode pair configured to input a voltage, a secondary side electrode configured to generate an output voltage according to the input voltage to the primary side electrode pair and a conductive resistor that couples the primary side electrode pair;
a first connection part connected to the primary side electrode pair of the piezoelectric element;
a second connection part connected to the secondary side electrode of the piezoelectric element; and
an opening arranged between the first connection part and the second connection part so as to prevent an occurrence of leakage between the first connection part and the second connection part, the opening passing through the printed circuit board,
wherein the conductive resistor is arranged between the first connection part and the opening when viewed from a direction perpendicular to the printed circuit board;
a semiconductor component mounted on the printed circuit board and connected to the piezoelectric element; and
a rectifying and smoothing circuit configured to rectify and smooth the voltage output by the secondary side electrode.

11. The image forming apparatus according to claim 10, wherein:
the semiconductor component is a field-effect transistor, and
the power supply further comprising:
a control unit configured to output a signal for driving the field-effect transistor,
wherein the control unit is further configured to control the voltage output from the secondary side electrode of the piezoelectric element by changing a frequency of the signal.

12. The image forming apparatus according to claim 11, further comprising a detection circuit configured to detect a voltage rectified and smoothed by the rectifying and smoothing circuit,
- wherein control unit is further configured to control the frequency of the signal based on a voltage detected by the detection circuit.

13. The image forming apparatus according to claim 10, wherein the image forming unit comprises:
- a charger which charges the image carrier;
- an electrostatic latent image forming unit which forms an electrostatic latent image on the image carrier charged by said charger;
- a developing unit which develops the electrostatic latent image to form a toner image; and
- a transfer unit which transfers the toner image onto a printing medium.

* * * * *